(12) United States Patent
Gurevich et al.

(10) Patent No.: US 12,362,538 B2
(45) Date of Patent: Jul. 15, 2025

(54) SYSTEMS FOR OPTICAL POWER CONTROL FOR LASER SAFETY OF A TIME-OF-FLIGHT ILLUMINATION SYSTEM

(71) Applicant: ZEBRA TECHNOLOGIES CORPORATION, Lincolnshire, IL (US)

(72) Inventors: Vladimir Gurevich, Great Neck, NY (US); Matthew D. Blasczak, Shirley, NY (US); Peter Fazekas, Bayport, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 909 days.

(21) Appl. No.: 17/531,240

(22) Filed: Nov. 19, 2021

(65) Prior Publication Data
US 2022/0077644 A1 Mar. 10, 2022

Related U.S. Application Data

(63) Continuation of application No. 16/227,653, filed on Dec. 20, 2018, now Pat. No. 11,211,766.

(51) Int. Cl.
*H01S 5/068* (2006.01)
*G01S 7/497* (2006.01)
(Continued)

(52) U.S. Cl.
CPC ........ *H01S 5/06825* (2013.01); *G01S 17/894* (2020.01); *H01S 3/10069* (2013.01);
(Continued)

(58) Field of Classification Search
CPC ........ H01S 3/10069; H01S 3/102; H01S 3/09; H01S 3/11; H01S 5/4025; H01S 5/0683;
(Continued)

(56) References Cited

U.S. PATENT DOCUMENTS 4,077,718 A * 3/1978 Graham, Jr. .......... G01S 7/4861
250/552
6,629,638 B1 * 10/2003 Sanchez ............... G01R 31/002
235/454

(Continued)

*Primary Examiner* — M. A. Golub-Miller
(74) *Attorney, Agent, or Firm* — Yuri Astvatsaturov

(57) ABSTRACT

A system is disclosed which includes a laser which has a calibrated optical power and a calibrated tolerance. The system includes a driving circuit configured to generate a first current pulse and a second current pulse. The system includes a primary observer module configured to observe a first and second primary input. The system includes one or more secondary observer modules configured to observe one or more first and one or more second secondary inputs. The system includes a controller communicatively coupled to the laser, driving circuit, primary observer module, and the one or more secondary observer modules. The controller is configured to receive an information packet, calculate an optical power, determine a deviation of the optical power from the calibrated optical power, compare the deviation with the calibrated tolerance, and perform an action if the deviation exceeds the calibrated tolerance.

9 Claims, 4 Drawing Sheets

(51) Int. Cl.
   *G01S 17/894*   (2020.01)
   *H01S 3/10*     (2006.01)
   *H01S 5/062*    (2006.01)
   *H01S 5/0683*   (2006.01)
   *G01S 7/484*    (2006.01)
   *H01S 3/09*     (2006.01)
   *H01S 3/102*    (2006.01)
   *H01S 3/11*     (2023.01)

(52) U.S. Cl.
   CPC ...... *H01S 5/06216* (2013.01); *H01S 5/06804* (2013.01); *H01S 5/06808* (2013.01); *G01S 7/484* (2013.01); *G01S 7/497* (2013.01); *H01S 3/102* (2013.01); *H01S 5/0683* (2013.01)

(58) Field of Classification Search
   CPC ............. H01S 5/06804; H01S 5/06808; H01S 5/06216; H01S 5/06825; G01S 7/484; G01S 7/497; G01S 7/4815; G01S 17/894
   See application file for complete search history.

(56) References Cited

U.S. PATENT DOCUMENTS

2010/0158055 A1* 6/2010 Giebel ............... G06K 7/10584
                                                372/29.011
2017/0242108 A1* 8/2017 Dussan ................... G01S 7/487
2019/0324126 A1* 10/2019 Bulteel ................... G01S 17/10

* cited by examiner

SYSTEMS FOR OPTICAL POWER CONTROL FOR LASER SAFETY OF A TIME-OF-FLIGHT ILLUMINATION SYSTEM

CROSS-REFERENCE TO RELATED APPLICATION

This application is a continuation of U.S. patent application Ser. No. 16/227,653, filed on Dec. 20, 2018, and incorporated herein by reference in its entirety.

BACKGROUND OF THE INVENTION

A time-of-flight (ToF) illumination system in a trailer monitoring unit (TMU) incorporates several high-power infra-red laser arrays. Each laser array may have optical power values reaching up to four watts. These arrays are used to illuminate a volume with high-frequency (HF) modulated light. This HF modulated light is synchronized by a ToF sensor.

Due to the high-power output of these ToF illumination systems, the laser arrays have the potential to cause serious damage to a human eye. To avoid damaging the eyes of a human observer, these illumination systems should satisfy Class 1 laser safety limits. To satisfy these laser safety limits, the optical power of a laser array is calibrated and maintained throughout the life of the laser array.

Traditionally, a laser array's optical power was calibrated with a primary observer and a secondary observer. The primary observer would be a built-in laser monitor photodetector to observe the fractional laser power while in active operation. Using the observations of the fractional laser power, it was possible to monitor the optical power of the laser to correspond with the optical power calibrated during manufacturing.

If the primary observer failed, the secondary observer would be used to provide an indirect measurement of the optical power. For example, a sense resistor could be used to measure the laser operating current. After the laser operating current was determined, the DIOP method could be used to validate the calibrated ratio between the fractional and peak laser power. In short, the DIOP method involves changing the applied current between two values, measuring the change in output of the primary observer, and comparing that change with the measured values of the secondary observer at both current levels.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
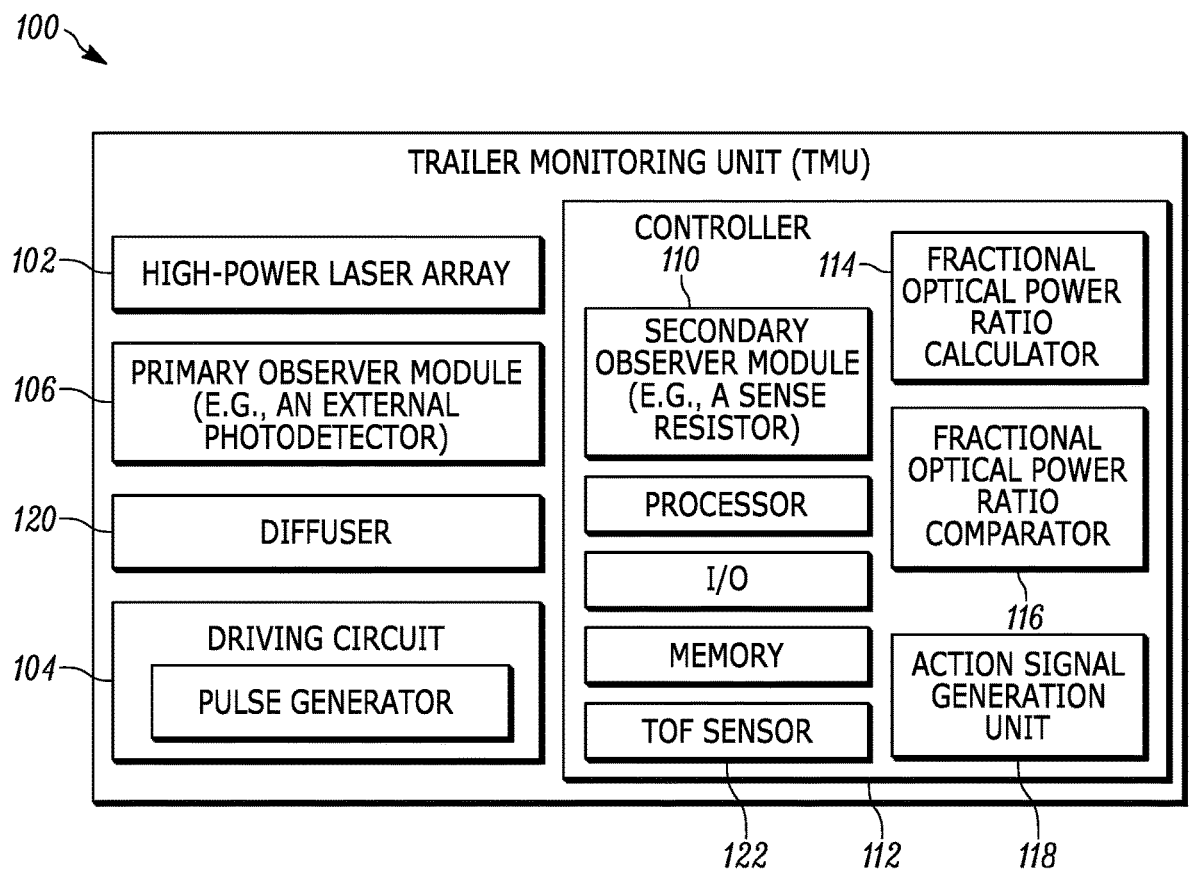
FIG. 1A illustrates an example system for optical power control of a ToF illumination system in accordance with various embodiments disclosed herein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The system components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

The problem associated with ToF illumination systems, in regard to the traditional calibration method, is that the high-power laser arrays used in the ToF sensors do not have built-in photodetectors to serve as the primary observer. Moreover, even if the ToF sensors did have built-in photodetectors, the HF-modulation of laser current required for the ToF system to function reduces the accuracy of traditional methods for laser optical power control.

For example, during operation, the optical power of a laser can change due to several factors including: a fault in the driver circuitry, a change in the laser operating temperature, and a change in the laser HF modulation duty cycle. Traditionally, the system responsible for maintaining the optical power of the laser would first calculate the fractional optical power of the laser. The system would then compare the calculated fractional optical power with the pre-calibrated fractional optical power. If the calculated fractional optical power was outside of a pre-calibrated tolerance from the pre-calibrated fractional optical power, then the laser would be deactivated.

However, if the system in place to control the optical power of the laser does not include a direct measurement of the optical power (e.g., a built-in photodetector), the system must rely on indirect measurements of optical power from quantities such as temperature and current. Using indirect measurements of the optical power is less accurate than directly measuring the fractional optical power, and can thus lead to less accurate decisions regarding whether to deactivate the laser.

Moreover, the HF modulation of current used in a ToF illumination system further reduces the accuracy of a measurement of the fractional optical power. These complications present a challenge in maintaining the optical power of the laser, which was set at calibration. Accordingly, there is a need for solutions that solve issues regarding optical power control of ToF illumination systems.

In various embodiments of the present disclosure, systems are described for optical power control of laser arrays in a ToF illumination system. The systems of the present disclosure provide solutions where, e.g., a laser array of a ToF illumination system requires accurate optical power control despite the lack of a built-in photodetector and HF modulation of the driving current.

Accordingly, in various embodiments herein, systems for optical power control of a ToF illumination system are disclosed. For example, a system of the present disclosure may include a laser. The laser may be characterized by having a calibrated fractional optical power ratio and a calibrated tolerance. The laser may be further characterized by each of the calibrated fractional optical power ratio and the calibrated tolerance being a constant. Both the calibrated fractional optical power ratio and the calibrated tolerance may be calibrated at the time of manufacturing. Alternatively, both the calibrated fractional optical power ratio and the calibrated tolerance may be calibrated during operation of the system. In various embodiments, the laser may be further characterized by having a calibrated peak optical power and a calibrated peak optical power tolerance.

The system may further include a driving circuit. The driving circuit may be configured to generate a first current pulse and a second current pulse. The second current pulse may be generated after the first current pulse. In various embodiments, the first current pulse may be non-modulated. In various other embodiments, the second current pulse may be modulated.

The system may further include a primary observer module. In various embodiments, the primary observer module may include an external photodetector, optical energy meter, or any other suitable device to detect fractional optical power. As further described herein, if the primary observer module is an external photodetector, optical energy meter, or any other suitable device to detect optical power, the primary observer module may be positioned to receive a portion of an outgoing laser beam from the laser. Alternatively, if the primary observer module is a temperature sensor, or other similar device, the primary observer module may be positioned proximate to the laser in order to observe the laser operating temperature or other suitable observable quantity to control optical power.

The primary observer module may be configured to observe a first primary input generated by the laser in response to the first current pulse. In various embodiments, the first primary input may include a fractional optical power. Alternatively, the first primary input may include a laser operating current, a laser operating temperature, or any other suitable observable quantity to control optical power.

The primary observer module may be configured to observe a second primary input generated by the laser in response to the second current pulse. In various embodiments, the second primary input may include a fractional optical power. Alternatively, the second primary input may include a laser operating current, a laser operating temperature, or any other suitable observable quantity to control optical power.

The system may further include one or more secondary observer modules. In various embodiments, the one or more secondary observer modules may include at least a sense resistor. Alternatively, the one or more secondary observer modules may include a sense resistor and temperature sensor, or any combination of devices configured to detect a suitable observable quantity to control optical power.

The one or more secondary observer modules may be configured to observe one or more first secondary inputs. The one or more first secondary inputs may be generated by the laser in response to the first current pulse. In various embodiments, the one or more first secondary inputs may include at least a laser operating current. Alternatively, the one or more first secondary inputs may include a laser operating current and a laser operating temperature, or any combination of suitable observable quantities to control optical power.

The one or more secondary observer modules may be configured to observe one or more second secondary inputs. The one or more second secondary inputs may be generated by the laser in response to the second current pulse. In various embodiments, the one or more second secondary inputs may include at least a laser operating current. Alternatively, the second secondary inputs may include a laser operating current and a laser operating temperature, or any combination of suitable observable quantities to control optical power.

The system may further include a controller. The controller may be communicatively coupled to the laser, the driving circuit, the primary observer module, and the one or more secondary observer modules. The controller may be configured to receive an information packet. The information packet may include the first primary input, the second primary input, the one or more first secondary inputs, and the one or more second secondary inputs.

The controller may be further configured to calculate a fractional optical power ratio using the information packet. Additionally, the controller may be configured to determine a deviation of the fractional optical power ratio from the calibrated fractional optical power ratio, compare the deviation with the calibrated tolerance, and perform an action if the deviation exceeds the calibrated tolerance. In various embodiments, the action may include deactivating the laser.

In various embodiments, the controller may be further configured to receive a first information packet including the first primary input and the one or more first secondary inputs. Additionally, in these embodiments, the controller may be further configured to determine a peak optical power using the first information packet, determine a first deviation of the peak optical power from the calibrated peak optical power, compare the first deviation with the calibrated peak optical power tolerance, and perform a first action if the first deviation exceeds the calibrated peak optical power tolerance.

In another embodiment, a system of the present disclosure may include a laser. The laser may be characterized by having a calibrated optical power and a calibrated tolerance. The laser may be further characterized by each of the calibrated optical power and the calibrated tolerance being a constant. Both the calibrated optical power and the calibrated tolerance may be calibrated at the time of manufacturing. Alternatively, both the calibrated optical power and the calibrated tolerance may be calibrated during operation of the system. In various embodiments, the laser may be further characterized by having a calibrated peak optical power and a calibrated peak optical power tolerance.

The system may further include a driving circuit. The driving circuit may be configured to generate a first current pulse and a second current pulse. The second current pulse may be generated after the first current pulse. In various embodiments, the first current pulse may be non-modulated. In various other embodiments, the second current pulse may be modulated.

The system may further include a plurality of primary observer modules. The plurality of primary observer modules may include at least a current regulator voltage and a temperature sensor. As further described herein, if the plurality of primary observer modules includes at least a current regulator voltage and a temperature sensor, the plurality of primary observer modules may be positioned proximate to the laser in order to observe the laser operating temperature or other suitable observable quantity to control optical power.

The plurality of primary observer modules may be configured to observe one or more first primary inputs generated by the laser in response to the first current pulse. In various embodiments, the one or more first primary inputs may include at least a laser operating current and a laser operating temperature.

The plurality of primary observer modules may be configured to observe one or more second primary inputs generated by the laser in response to the second current pulse. In various embodiments, the one or more second primary inputs may include at least a laser operating current and a laser operating temperature.

The system may further include a plurality of secondary observer modules. In various embodiments, the plurality of secondary observer modules may include at least a sense resistor and one or more temperature sensors, or any combination of devices configured to detect a suitable observable quantity to control optical power.

The plurality of secondary observer modules may be configured to observe one or more first secondary inputs. The one or more first secondary inputs may be generated by the laser in response to the first current pulse. In various embodiments, the one or more first secondary inputs may include at least a laser operating current and a laser operating temperature.

The one or more secondary observer modules may be configured to observe one or more second secondary inputs. The one or more second secondary inputs may be generated by the laser in response to the second current pulse. In various embodiments, the one or more second secondary inputs may include at least a laser operating current and a laser operating temperature.

The system may further include a controller. The controller may be communicatively coupled to the laser, the driving circuit, the plurality of primary observer modules, and the plurality of secondary observer modules. The controller may be configured to receive an information packet. The information packet may include the one or more first primary inputs, the one or more second primary inputs, the one or more first secondary inputs, and the one or more second secondary inputs.

The controller may be further configured to calculate an optical power using the information packet. Additionally, the controller may be configured to determine a deviation of the optical power from the calibrated optical power, compare the deviation with the calibrated tolerance, and perform an action if the deviation exceeds the calibrated tolerance. In various embodiments, the action may include deactivating the laser.

In various embodiments, the controller may be further configured to receive a first information packet including the first primary input and the one or more first secondary inputs. Additionally, in these embodiments, the controller may be further configured to determine a peak optical power using the first information packet, determine a first deviation of the peak optical power from the calibrated peak optical power, compare the first deviation with the calibrated peak optical power tolerance, and perform a first action if the first deviation exceeds the calibrated peak optical power tolerance.

FIG. 1A illustrates an example system 100 for optical power control of a ToF illumination system in accordance with various embodiments disclosed herein. System 100 includes a laser 102 (illustrated here as a "high power laser array") and a driving circuit 104. The driving circuit 104 may be configured to generate a first current pulse and a second current pulse. In various embodiments, the second current pulse may be generated after the first current pulse. For example, and as further described below in FIG. 3, the driving circuit 104 may generate a first current pulse 306 to measure the peak laser power.

The driving circuit 104 may generate a second current pulse 310 to test the average laser power after a ToF sensor 122 provides a modulation duty cycle for the laser 102 output. For example, the modulation duty cycle may be about 50%.

System 100 further includes a primary observer module 106, illustrated in this embodiment as an external photodetector. The primary observer module 106 may be positioned to receive a portion of an outgoing laser beam from the laser 102. For example, the primary observer module 106 may be positioned by an area of a diffuser 120, exit window, or other element of the laser 102 to receive the portion of the outgoing laser beam. After receiving the portion of the outgoing laser beam, the primary observer module 106 transmits a measurement of the fractional optical power to the controller 112.

System 100 further includes one or more secondary observer modules 110, illustrated in this embodiment as a sense resistor. The one or more secondary observer modules 110 are communicatively coupled to the laser 102 to observe one or more first secondary inputs and one or more second secondary inputs generated by the laser 102. For example, the one or more first secondary inputs and the one or more second secondary inputs may include a laser operating current, a laser operating temperature, or both a laser operating current and a laser operating temperature.

As pictured in FIG. 1A, the one or more secondary observer modules 110 may be positioned inside the controller 112. Alternatively, the one or more secondary observer modules 110 may be positioned outside the controller 112, or any other location to observe the one or more first secondary inputs and the one or more second secondary inputs.

System 100 further includes a controller 112. The controller 112 is communicatively coupled to the laser 102, the driving circuit 104, the primary observer module 106, and the one or more secondary observer modules 110. The controller 112 is configured to receive an information packet including the first primary input, the second primary input, the one or more secondary inputs, and the one or more second secondary inputs. For example, in various embodiments, the primary observer 106 transmits the first primary input and the second primary input to the controller 112. Further in this example, the one or more secondary observer modules 110 transmits the one or more first secondary inputs and the one or more second secondary inputs to the controller 112.

The controller 112 is further configured to calculate a fractional optical power ratio using the information packet. Additionally, the controller may be configured to determine a deviation of the fractional optical power ratio from the calibrated fractional optical power ratio, compare the deviation with the calibrated tolerance, and perform an action if the deviation exceeds the calibrated tolerance.

In this way, the controller 112 may detect when the fractional optical power has changed with respect to the calibrated fractional optical power. Once that detection is made, the controller 112 may send a signal to the driving circuit 104 to deactivate the driving voltage 302 to the system (i.e., deactivate the laser).

For example, during operation, the laser operating temperature might rise corresponding to normal operating conditions of the laser 102. Under these normal operating conditions, the driving circuit 104 would change the laser operating current to compensate for the change in laser operating temperature, and the fractional optical power would remain relatively unchanged. However, if a fault occurs in the system, the fractional optical power may change disproportionately to the changes in temperature and current. Should this change in fractional optical power be sizeable enough to fall outside the calibrated tolerance, the laser 102 should be deactivated to avoid potential eye safety hazards.

To perform these operations, the controller 112 may receive the information packet at a fractional optical power ratio calculator 114. The fractional optical power ratio calculator 114 may then calculate the fractional optical power ratio and send the fractional optical power ratio to the fractional optical power ratio comparator 116. The fractional optical power ratio comparator 116 may then compare the fractional optical power ratio to the calibrated fractional optical power ratio to determine a deviation of the fractional optical power ratio from the calibrated fractional optical power ratio. The fractional optical power ratio comparator 116 may then send the deviation to the action signal generation unit 118. The action signal generation unit 118 may then send a signal to the driving circuit 104 to, for example, deactivate the driving voltage 302 to the laser 102.

Figure 1B:
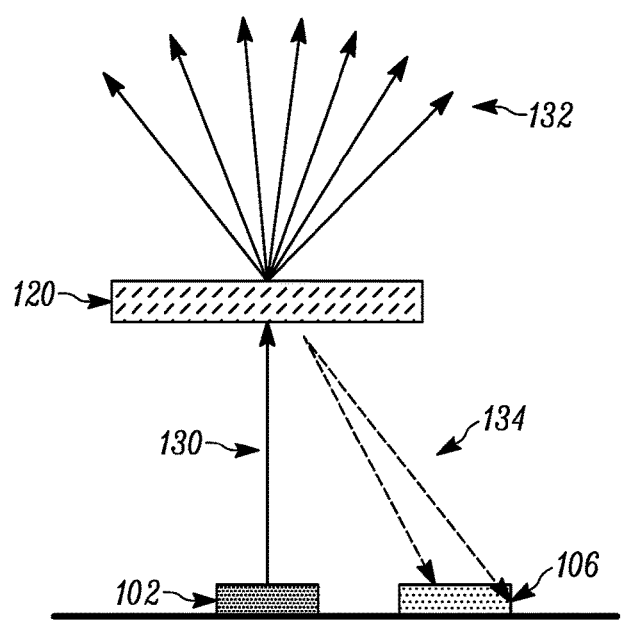
FIG. 1B illustrates an example operational diagram of a portion of the system of FIG. 1A in accordance with various embodiments disclosed herein.

FIG. 1B illustrates an example operational diagram of a portion of the system of FIG. 1A in accordance with various embodiments disclosed herein. In this example, the laser 102 generates a radiation beam 130. The radiation beam 130 hits the diffuser 120 and scatters into a desired illumination pattern 132. A portion of the radiation beam 130 will reflect back from the diffuser 120 in the direction of the primary observer module 106. The primary observer module 106 will observe a portion of this reflected light 134, referenced herein as monitor radiation, and register a fractional optical power of the laser 102.

In this example, and in accordance with the system disclosed in FIG. 1A, the calibrated fractional optical power ratio is determined by comparing the radiation of the desired illumination pattern 132 and the monitor radiation 134. This calibration may be performed during manufacturing, or at any other suitable time. Further in this example, and as discussed further herein, the one or more secondary observers (not shown) verify both that the fractional optical power ratio does not deviate beyond the calibrated tolerance and that the ToF sensor 122 provides the correct modulation duty cycle for the laser 102.

Figure 2:
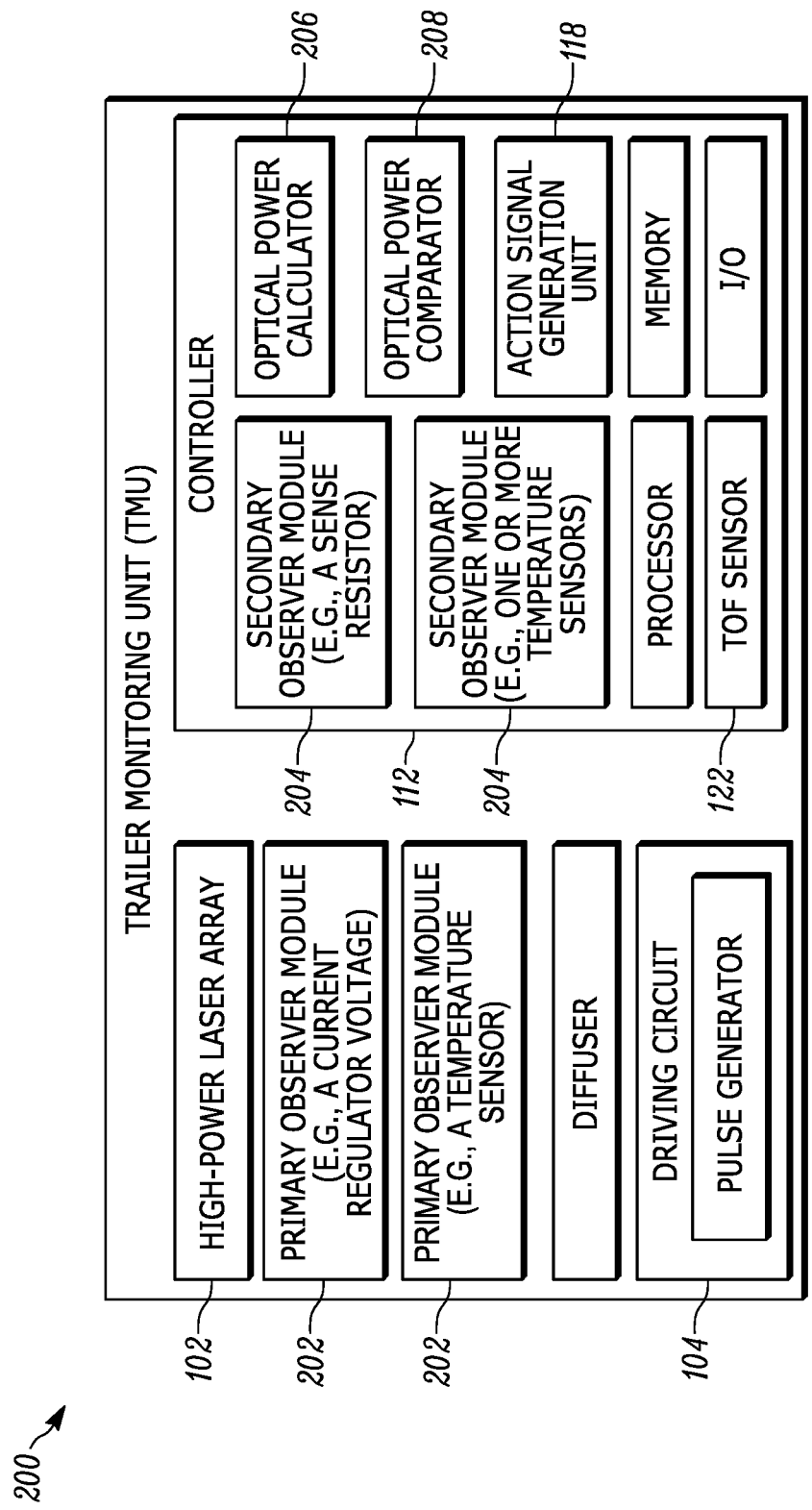
FIG. 2 illustrates an example system for optical power control of a ToF illumination system in accordance with various embodiments disclosed herein.

FIG. 2 illustrates an example system for optical power control of a ToF illumination system in accordance with various embodiments disclosed herein. System 200 includes the laser 102 (illustrated here as a "high power laser array"), the driving circuit 104, the controller 112, the action signal generation unit 118, and the ToF sensor 122, as discussed above in reference to FIG. 1A.

System 200 further includes a plurality of primary observer modules 202, illustrated in this embodiment as a current regulator voltage and a temperature sensor. The plurality of primary observer modules 202 may be placed proximate to the laser 102 to observe the laser operating temperature. The current regulator voltage may be calibrated in manufacturing and based on the measured optical power of the laser.

System 200 further includes a plurality of secondary observer modules 204, illustrated in this embodiment as a sense resistor and one or more temperature sensors. The plurality of secondary observer modules 204 may, for example, observe the laser operating current and the laser operating temperature. The plurality of secondary observer modules 204 may be located in the controller 112, as illustrated in FIG. 2, or outside the controller 112.

The controller 112 of system 200 further includes an optical power calculator 206. The optical power calculator 206 receives a laser operating current measurement and a laser operating temperature measurement from both the plurality of primary observer modules 202 and the plurality of secondary observer modules 204. The optical power calculator 206 then calculates an optical power based on the received laser operating current measurements and values retrieved from lookup tables corresponding to the received laser operating temperature measurements.

The controller 112 of system 200 further includes an optical power comparator 208. The optical power comparator 208 may receive the optical power from the optical power calculator 206 and compare the optical power to the calibrated optical power. The optical power comparator 208 may then determine a deviation of the optical power from the calibrated optical power, compare the deviation with the calibrated tolerance, and send the deviation to the action signal generation unit 118 if the deviation exceeds the calibrated tolerance.

Figure 3:
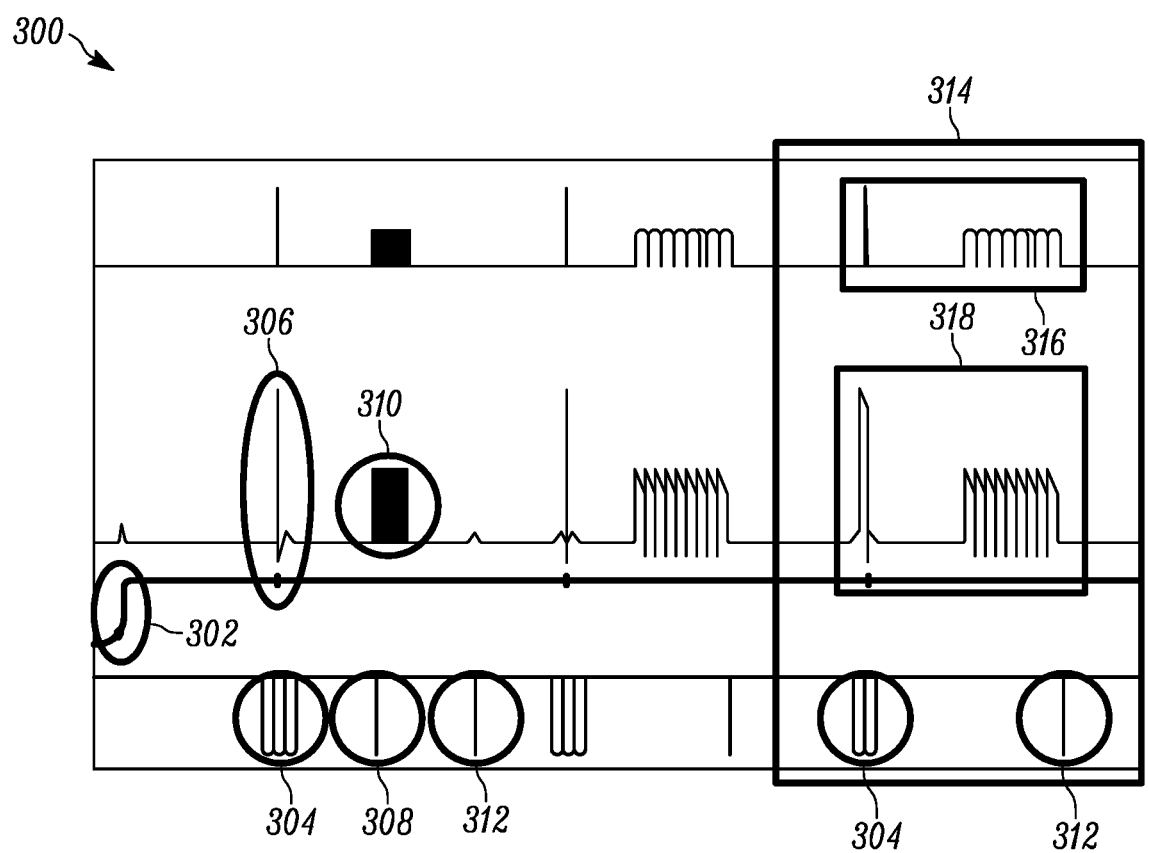
FIG. 3 illustrates a no-fault operational run of a system for optical power control of a ToF illumination system in accordance with various embodiments disclosed herein.

FIG. 3 illustrates a no-fault operational run 300 of a system for optical power control of a ToF illumination system in accordance with various embodiments disclosed herein. The no-fault operational run 300 includes a driving voltage 302, as supplied by the driving circuit 104. The driving voltage 302 may be, for example, about 7 to about 15 volts or any value sufficient to drive the laser 102.

After the driving voltage 302 is activated, the laser 102 is run through an unmodulated laser pulse test 304. In various embodiments, the unmodulated laser pulse test 304 may include a sequence of three trigger signals. The first trigger signal determines if the laser 102 is inactive (i.e., turned off). The second trigger signal determines if the laser 102 is active (i.e., turned on) and that the first current pulse 306 has an expected amplitude, as measured by a sense resistor. The third trigger signal determines if the laser 102 is inactive. Alternatively, the unmodulated laser pulse test 304 may include any number of trigger signals. If the unmodulated laser pulse test 304 is successful, the laser 102 will remain deactivated during the first trigger signal, the laser 102 will activate with the first current pulse 306 during the second trigger signal, the first current pulse 306 will have an expected amplitude during the second trigger signal, and the laser 102 will deactivate prior to the third test signal.

In various embodiments, the controller 112 will receive the one or more first primary inputs from the primary observer module 106 or plurality of primary observer modules 202 and the one or more first secondary inputs from the one or more secondary observer modules 110 or the plurality of secondary observer modules 204 after the first current pulse 306. The controller 112 will then determine the peak optical power of the laser 102 from the first current pulse 306, determine the first deviation of the peak optical power from the calibrated peak optical power, and compare the first deviation with the calibrated peak optical tolerance. In these embodiments, if the primary observer module 106, the plurality of primary observer modules 202, the one or more secondary observer modules 110, or the plurality of secondary observer modules 204 includes a temperature sensor, then the controller 112 may access lookup tables to determine the peak optical power of the laser 102.

In these embodiments, if the first deviation exceeds the calibrated peak optical tolerance, then the controller 112 will send a signal to the driving circuit 104 to, for example, deactivate the driving voltage 302 to the laser 102. However, if the deviation does not exceed the calibrated peak optical tolerance, the unmodulated laser pulse test 304 is successful.

After the unmodulated laser pulse test 304, the controller 112 may receive the one or more first primary inputs from the primary observer module 106 or plurality of primary observer modules 202 and the one or more first secondary inputs from the one or more secondary observer modules 110 or the plurality of secondary observer modules 204. Alternatively, the controller 112 may receive the one or more first primary inputs from the primary observer module 106 or plurality of primary observer modules 202 and the one or more first secondary inputs from the one or more secondary observer modules 110 or the plurality of secondary observer modules 204 after the modulated laser test 308.

Assuming a successful unmodulated laser pulse test 304, the no-fault operational run 300 continues to a modulated laser test 308. The modulated laser test 308 determines if the ToF sensor 122 provided the correct modulation duty cycle for the laser 102 output.

The modulated laser test 308 detects the second current pulse 310. In this embodiment, the second current pulse 310 is modulated according to the modulation duty cycle provided by the ToF sensor 122. As shown in FIG. 3, the laser 102 is being driven at about a 50% duty cycle during the second current pulse 310.

After the modulated laser test 308, the controller 112 is configured to receive the one or more second primary inputs from the primary observer module 106 and the one or more second secondary inputs from the one or more secondary observer modules 110. The controller 112 will then determine the fractional optical power ratio of the laser 102 based on the first current pulse 306 and the second current pulse 310, determine the deviation of the fractional optical power ratio from the calibrated fractional optical power ratio, and compare the deviation with the calibrated tolerance. If the deviation exceeds the calibrated tolerance, then the controller 112 will send a signal to the driving circuit 104 to, for example, deactivate the driving voltage 302 to the laser 102.

In alternative embodiments, after the modulated laser test 308, the controller 112 is configured to receive the one or more second primary inputs from the plurality of primary observer modules 202 and the one or more second secondary inputs from the plurality of secondary observer modules 204. The controller 112 will then determine the optical power of the laser 102 based on the first current pulse 306 and the second current pulse 310, determine the deviation of the optical power from the calibrated optical power, and compare the deviation with the calibrated tolerance. If the deviation exceeds the calibrated tolerance, then the controller 112 will send a signal to the driving circuit 104 to, for example, deactivate the driving voltage 302 to the laser 102.

The no-fault operational run 300 further includes an end of frame test 312. The end of frame test 312 ensures that the modulation provided by the ToF sensor 122 has deactivated.

In various embodiments, after the unmodulated laser pulse test 304, modulated laser test 308, and end of frame test 312 are each completed, the no-fault operational run 300 continues to operate in a series of operational frames, representative of the operational frames is operational frame 314. For example, in operational frame 314, the laser output 316 is dictated by the measured driving current 318 supplied by the driving circuit 104. The laser output 316 and measured driving current 318 are again tested by the unmodulated laser pulse test 304 and the end of frame test 312.

In this embodiment, the first current pulse 306, the unmodulated laser pulse test 304, and the end of frame test 312 are each repeated in each of the operational frames, for example operational frame 314. It should be understood that this step need not be included in all subsequent operational frames, but should be repeated as often as the system's timing or physical constraints will allow, or as often as is necessary to achieve the desired eye safety standards.

Moreover, it should be understood that the modulated laser test 308 and the second laser pulse 310 may also each be repeated in each of the operational frames, for example operational frame 314. Similar to the first current pulse 306, the unmodulated laser pulse test 304, and the end of frame test 312, the modulated laser test 308 and the second laser pulse 310 should be repeated as often as the system's timing or physical constraints will allow, or as often as is necessary to achieve the desired eye safety standards.

Figure 4:
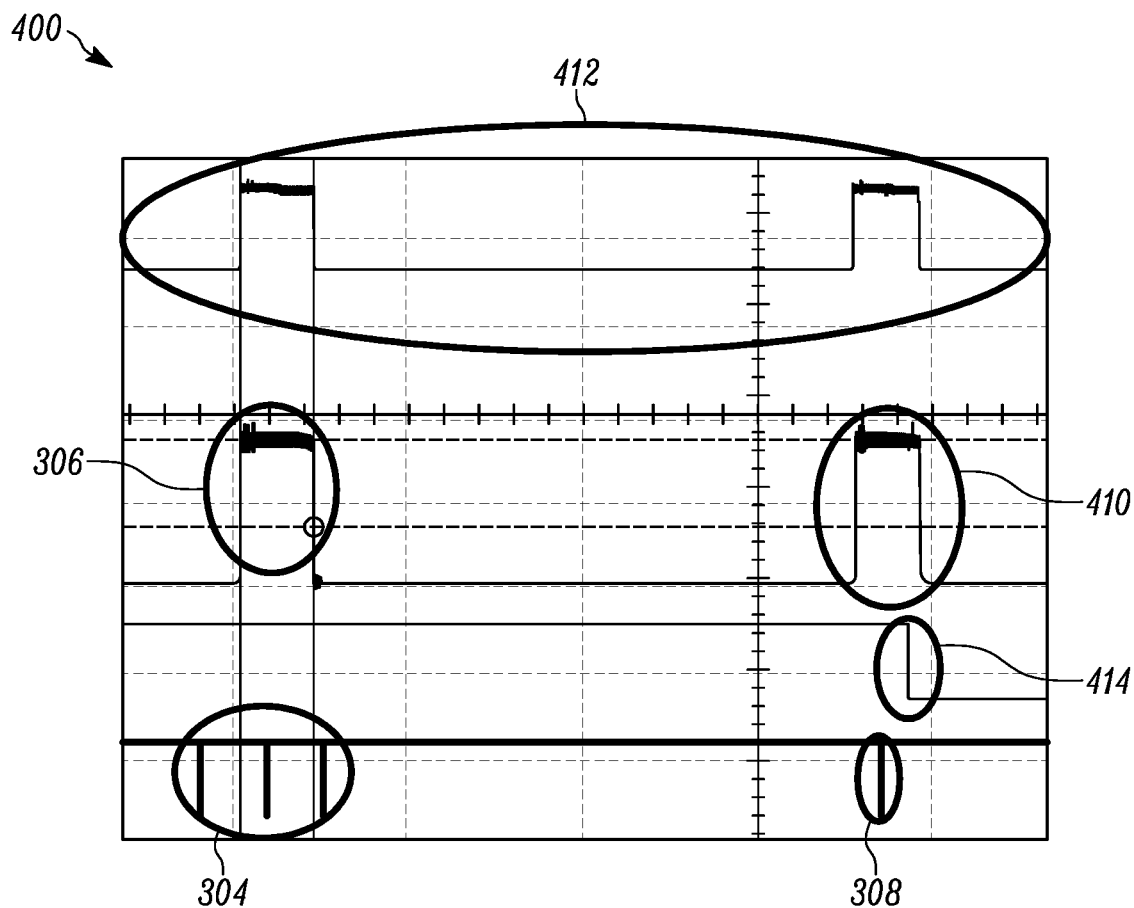
FIG. 4 illustrates a fault operational run of a system for optical power control of a ToF illumination system in accordance with various embodiments disclosed herein.

FIG. 4 illustrates a fault operational run 400 of a system for optical power control of a ToF illumination system in accordance with various embodiments disclosed herein. The fault operational run 400 includes the unmodulated laser pulse test 304 and the first current pulse 306 during the second test signal.

The fault operational run 400 further includes the modulated laser test 308. In this example, the modulated laser test 308 fails because no modulation is applied to the laser operating current, as displayed in 410. Thus, the fault laser output 412 does not reflect a change in optical power.

Once the modulated laser test 308 fails, the controller 112 determines that the laser 102 is operating under a fault condition. To prevent potential damage to the laser 102 or any potential observers, the controller 112 sends a signal to the driving circuit 104 to deactivate the driving voltage 302 to the laser 102, as illustrated in 414.

It should be understood that the fault operational run 400 discloses a particular fault operation of the systems disclosed herein, and should not be considered the only fault operation of the systems disclosed herein.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the systems described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A TOF laser illumination system with fault detection, comprising:
   a laser characterized by having a calibrated optical power and a calibrated tolerance, wherein each of the calibrated optical power and the calibrated tolerance is a constant;
   a driving circuit configured to:
   generate a first current pulse, and
   generate a second current pulse after the first current pulse, wherein the second current pulse is different from the first current pulse in at least one of amplitude or duration;
   a plurality of primary observer modules configured to:
   observe one or more first primary inputs as generated by the laser in response to the first current pulse, and
   observe one or more second primary inputs generated by the laser in response to the second current pulse;
   a plurality of secondary observer modules configured to:
   observe one or more first secondary inputs generated by the laser in response to the first current pulse, and
   observe one or more second secondary inputs generated by the laser in response to the second current pulse; and
   a controller communicatively coupled to the laser, the driving circuit, the plurality of primary observer modules, and the plurality of secondary observer modules, wherein the controller is configured to:
   receive an information packet including the one or more first primary inputs, the one or more second primary inputs, the one or more first secondary inputs, and the one or more second secondary inputs,
   calculate an optical power using the information packet,
   determine a deviation of the optical power from the calibrated optical power, compare the deviation with the calibrated tolerance, and
   perform an action if the deviation exceeds the calibrated tolerance,
   wherein one of the plurality of primary observer modules is a different type of sensor from one of the plurality of secondary observer modules, and
   wherein the plurality of primary observer modules includes a current regulator voltage and a temperature sensor.

2. The system of claim 1, wherein the laser is further characterized by having a calibrated peak optical power and a calibrated peak optical power tolerance.

3. The system of claim 2, wherein the controller is further configured to:
   receive a first information packet including the one or more first primary inputs and the one or more first secondary inputs,
   determine a peak optical power using the first information packet,
   determine a first deviation of the peak optical power from the calibrated peak optical power,
   compare the first deviation with the calibrated peak optical power tolerance, and
   perform a first action if the first deviation exceeds the calibrated peak optical power tolerance.

4. The system of claim 1, wherein the one or more first primary inputs and the one or more second primary inputs include at least a laser operating current and a laser operating temperature.

5. The system of claim 1, wherein the plurality of secondary observer modules includes a sense resistor and one or more temperature sensors.

6. The system of claim 5, wherein the one or more first secondary inputs and the one or more second secondary inputs include a laser operating current and a laser operating temperature.

7. The system of claim 1, wherein the first current pulse is non-modulated.

8. The system of claim 1, wherein the second current pulse is modulated.

9. The system of claim 1, wherein the action includes deactivating the laser.

* * * * *